(12) United States Patent
Zhao et al.

(10) Patent No.: US 7,005,370 B2
(45) Date of Patent: Feb. 28, 2006

(54) METHOD OF MANUFACTURING DIFFERENT BOND PADS ON THE SAME SUBSTRATE OF AN INTEGRATED CIRCUIT PACKAGE

(75) Inventors: Lun Zhao, London (GB); Wan Lay Looi, Jahore (MY); Kyaw Oo Aung, Clementi (SG); Yonggang Jin, Singapore (SG); Jae-Yong Song, Singapore (SG); Won Sun Shin, Suwon (KR)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/846,176

(22) Filed: May 13, 2004

(65) Prior Publication Data

US 2005/0253262 A1  Nov. 17, 2005

(51) Int. Cl.
*H01L 21/441* (2006.01)

(52) U.S. Cl. .................................. 438/614; 438/615

(58) Field of Classification Search ................ 438/108, 438/127, 612, 613, 614, 615, 617
See application file for complete search history.

(56) References Cited

U.S. PATENT DOCUMENTS

| 6,204,074 B1 * | 3/2001 | Bertolet et al. ............... 438/18 |
| 6,749,760 B1 * | 6/2004 | Danielson et al. ............ 216/13 |
| 6,762,117 B1 * | 7/2004 | Lam et al. .................. 438/612 |

* cited by examiner

*Primary Examiner*—Stephen W. Smoot
(74) *Attorney, Agent, or Firm*—Mikio Ishimaru

(57) ABSTRACT

A method for manufacturing an integrated circuit package is provided with a substrate having first and second contact pads exposed through a passivation layer on the substrate. A first metallurgy layer is formed over the substrate. A second metallurgy layer is formed over the first metallurgy layer. The first metallurgy layer is removed while leaving a portion thereof over the second contact pad. The second metallurgy layer is removed while leaving a portion thereof over the second contact pad. A protective layer is formed over the first contact pad while removing the first metallurgy layer.

10 Claims, 4 Drawing Sheets

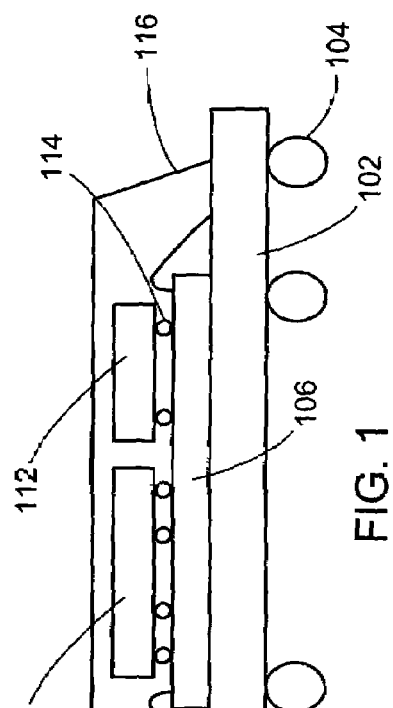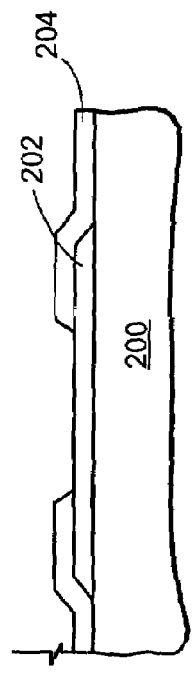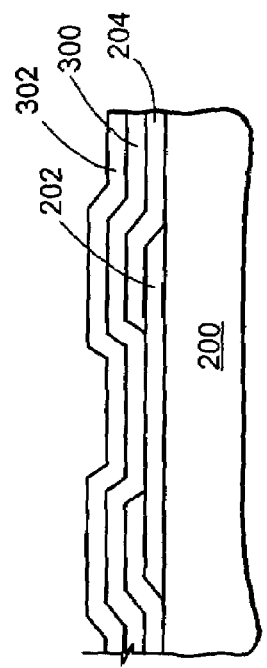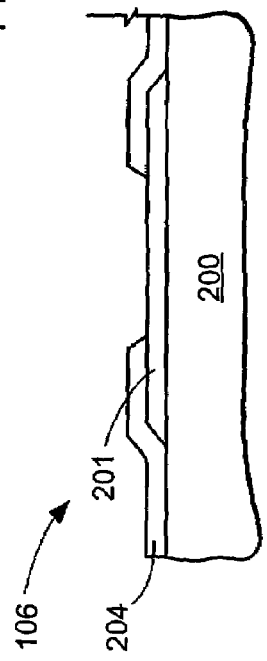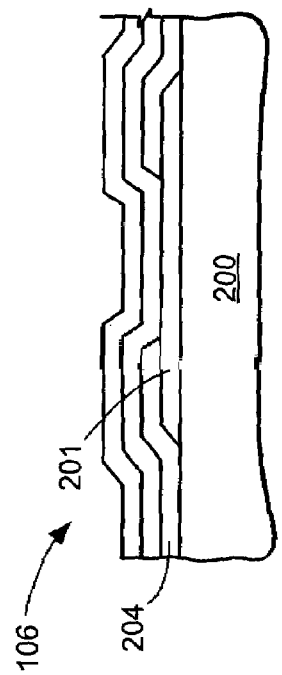
FIG. 1
FIG. 2
FIG. 3

METHOD OF MANUFACTURING DIFFERENT BOND PADS ON THE SAME SUBSTRATE OF AN INTEGRATED CIRCUIT PACKAGE

BACKGROUND

1. Technical Field

The present invention relates generally to the fabrication of semiconductor integrated circuits, and more specifically to bonding techniques used for integrated circuit packaging.

2. Background Art

With continuously decreasing semiconductor device dimensions and increasing device-packaging densities, the packaging of semiconductor devices has continued to gain in importance. In the electronics industry, the continuing goal has been to reduce the size of electronic devices such as in digital cameras and camcorders.

In the past, integrated circuits were packaged in leadframe packages using wire bonds using metal wires, but the packaging technology has been moving towards ball bond packages using solder balls, which allow for a higher density of connections.

Because the marketplace is in the process of transition, it is desirable to mix both wire and ball bonds in the same integrated circuit package.

Unfortunately, the requirements for wire and ball bonds are different. For example, aluminum (Al) is typically used for the wires because it is a very easily bent with little springback. Al bonds well to pads of Al. On the other hand, tin (Sn) solder is typically used for the balls because it has a high surface tension for forming small balls. Sn solder bonds well to pads of copper (Cu), which is a very good soldering wettable material.

The above results in the requirement for Al bond pads for wire bonds and Cu bond pads for ball bonds. Unfortunately, Al wire does not bond well with Cu bond pads and Sn solder does not bond well with Al bond pads.

In the past, Al was used in the final metal pads during integrated circuit fabrication, and Cu pads were made by thin-film deposition over the Al pads by an additional step of evaporation or sputtering. The thin-film layers of Cu are referred to as "under bump metallurgy" (UBM). The UBM plays a critical role as an adhesion layer between Al pads and solder bumps. To get different metal pads in one integrated circuit package, various approaches have been attempted, but have had the problems of requiring different masks to protect the Al pad in order to obtain a desired UBM.

Solutions to these problems have been long sought but prior developments have not taught or suggested any solutions and, thus, solutions to these problems have long eluded those skilled in the art.

SUMMARY OF THE INVENTION

The present invention provides a method for manufacturing an integrated circuit package with a substrate. First and second contact pads are exposed through a passivation layer on the substrate. A first metallurgy layer is formed over the substrate. A second metallurgy layer is formed over the first metallurgy layer. The first metallurgy layer is removed while leaving a portion thereof over the second contact pad. The second metallurgy layer is removed while leaving a portion thereof over the second contact pad. A protective layer is formed over the first contact pad while removing the first metallurgy layer.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a view of an integrated circuit package in accordance with the present invention;

FIG. 2 is a close-up view of a portion of one of the structure in FIG. 1 in an intermediate stage of manufacture according to the present invention;

FIG. 3 is the structure of FIG. 2 after deposition of first and second under bump metallurgy layers;

DETAILED DESCRIPTION OF THE INVENTION

Figure 4:
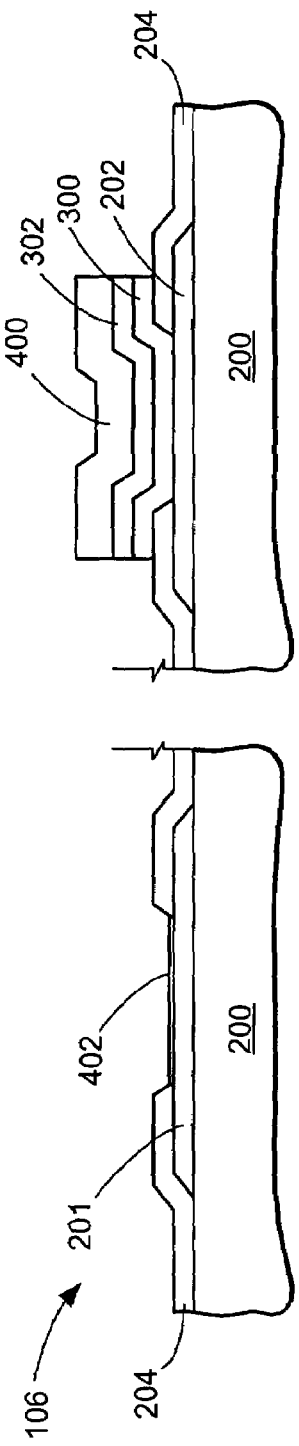
FIG. 4 is the structure of FIG. 3 after deposition and patterning of a photoresist.

Referring now to FIG. 1, therein is shown an integrated circuit package 100 in accordance with the present invention. The integrated circuit package 100 has a package substrate 102 with solder balls 104 on the bottom, and a bottom semiconductor die 106 on the top.

The bottom semiconductor die 106 is wire bonded by wire bonds 108 to the package substrate 102. On top of the bottom semiconductor die 106 are top semiconductor dies 110 and 112 that are ball bonded by ball bonds 114.

The bottom semiconductor die 106 and the top semiconductor dies 110 and 112 are encapsulated by an encapsulant 116 of a material such as epoxy or plastic. Each of the dies have semiconductor material substrates and may be connected in different combinations by different combinations of wire and ball bonds within the integrated circuit package 100.

The term "horizontal" as used herein is defined as a plane parallel to the conventional plane or surface of the package substrate 102, regardless of its orientation. The term "vertical" refers to a direction perpendicular to the horizontal as just defined. Terms, such as "on", "above", "below", "bottom", "top", "over", and "under", are defined with respect to the horizontal plane.

In the following description, numerous specific details are given to provide a thorough understanding of the invention. However, it will become apparent that the invention may be practiced without these specific details. In order to avoid obscuring the present invention, some well-known system configurations and process steps are not disclosed in detail.

Likewise, the drawings showing embodiments of the invention are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof, like features one to another will ordinarily be described with like reference numerals.

The term "processing" as used herein includes deposition of material or photoresist, patterning, exposure, development, etching, cleaning, and/or removal of the material or photoresist as required in forming a described structure. The term "forming" as used herein includes processes such as depositing, growing, building, chemically combining, or other processes for forming layers, films, and structures.

Referring now to FIG. 2, therein is shown a close-up view of a top or bottom surface of semiconductor die or package substrate in an intermediate stage of manufacture according to the present invention. The semiconductor die could be the bottom semiconductor die 106 or the top semiconductor dies 110 or 112, or the package substrate 102.

In one embodiment, the top of the bottom semiconductor die 106 includes a portion generically described as a substrate 200. The substrate 200 has first and second input/output (I/O) contact pads 201 and 202 exposed through a passivation layer 204 thereon.

The first and second I/O contact pads 201 and 202 are generally of wire-bond pad material such as aluminum (Al), or an alloy of aluminum such as aluminum/copper (AlCu). The passivation layer 204 is of a dielectric material such as silicon oxide ($SiO_2$).

Referring now to FIG. 3, therein is shown the structure of FIG. 2 after deposition of first and second under bump metallurgy (UBM) layers 300 and 302.

The first UBM layer 300 is of a material which is processed or etched by an etchant which will chemically combine with the material of the first and second I/O contact pads 201 and 202 to form a thin protective layer which will prevent further etching of the first and second I/O contacts pads 201 and 202 as will be further explained later. For example, for I/O contact pads containing Al, the first UBM layer 300 could be of titanium (Ti), which is etched with hydrofluoric acid (HF). The HF would react with Al to form a very thin aluminum fluoride (AlF) layer, less than 100 Å thick, that acts as a protective layer for the remainder of the Al.

The second UBM layer 302 is of a material which bonds well to the first UBM layer 300. For Ti, the second UBM layer 302 can be nickel vanadium (NiV) or copper (Cu). Both NiV and Cu provide good soldering wettable materials for ball bonds.

Referring now to FIG. 4, therein is shown the structure of FIG. 3 after deposition and patterning of a photoresist 400. The photoresist 400 is patterned followed by processing or etching removal of the first and second UBM layers 300 and 302 from all areas except over the second I/O contact pad 202. The etchant used for the first UBM layer 300 is one that forms a protective layer 402 over the first I/O contact pad 201.

Figure 5:
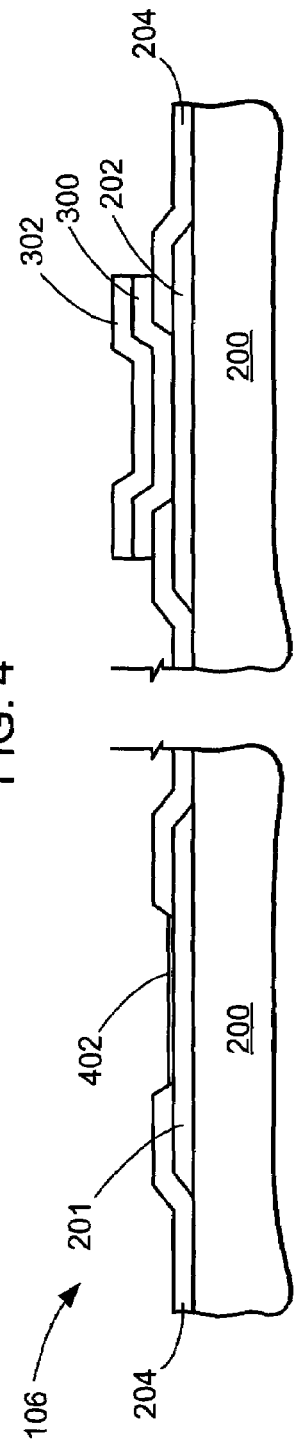
FIG. 5 is the structure of FIG. 4 in accordance with one embodiment of the present invention after removal of the photoresist.

Referring now to FIG. 5, therein is shown the top of the bottom semiconductor die 106 in accordance with an embodiment of the present invention after removal of the photoresist 400 from the second UMB layer 302. This structure provides the first I/O contact pad 201, which could be of Al, protected by the protective layer 402 and the second I/O contact pad 202 having the second UMB layer 302, which could be of Cu.

Figure 6:
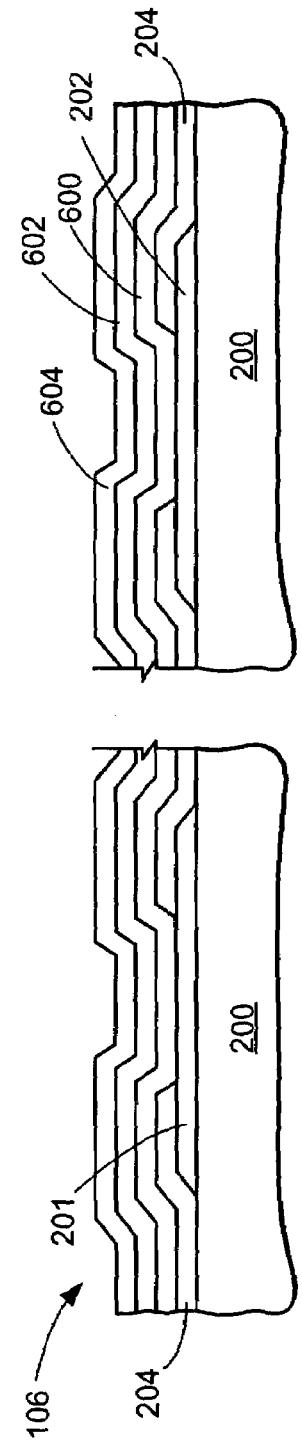
FIG. 6 is the structure of FIG. 2 after deposition of an input/output cap layer, and first and second under bump metallurgy layers.

Referring now to FIG. 6, therein is shown the structure of FIG. 2 after deposition of an I/O cap layer 600, a first UBM layer 602 and a second UBM layer 604. The I/O cap layer 600 is a wire-bond pad material selected based on the material of the first and/or second I/O contact pads 201 and/or 202 not being the desired material for wire bonding pads, such as Cu. For example, the I/O cap layer 600 can be of pure Al, AlCu, or another alloy selected to bond well to the first and/or second I/O contact pads 201 and/or 202 and to the first UBM layer 602.

The first UBM layer 602 is of a material which is etched by an etchant which will chemically combine with the material of the I/O cap layer 600 to form a thin protective layer which will prevent further etching of the I/O cap layer 600 as will be further explained later.

For example, it has been discovered that for I/O contact pads containing Al, the first UBM layer 602 could be of Ti, which is etched with HF. The HF would react with Al to form a very thin AlF layer of less than 100 Å thick that acts as a protective layer for the remainder of the Al during the etching of the titanium with a HF etchant having less than 1% HF. The second UBM layer 604 is then of a material which bonds well to the first UBM layer 602. For Ti, the second UBM layer 604 can be NiV or Cu. Both NiV and Cu provide good soldering wettable materials for ball bonds. This embodiment of the present invention allows a single mask to be used to obtain the UBM and protect the Al bond pad.

Figure 7:
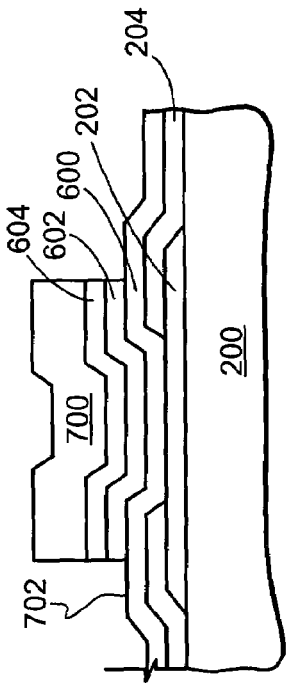
FIG. 7 is the structure of FIG. 6 after deposition and patterning with a photoresist.

Referring now to FIG. 7, therein is shown the structure of FIG. 6 after deposition and patterning with a photoresist 700. The photoresist 700 is used during the processing or etching of the first and second UBM layers 602 and 604. Because of the formation of a protective layer 702 on the I/O cap layer 600 by the etchant used for the first UBM layer 602, the I/O cap layer 600 is not etched.

Figure 8:
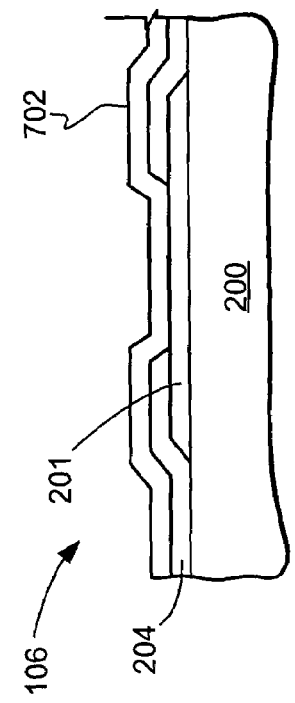
FIG. 8 is the structure of FIG. 7 after deposition and patterning of a photoresist over the first input/output contact pad.

Referring now to FIG. 8, therein is shown the structure of FIG. 7 after deposition and patterning of a photoresist 800 over the first I/O contact pad 201 and the I/O cap layer 600. The photoresist 800 for the first I/O contact pad 201 and the first and second UBM layers 602 and 604 for the second I/O contact pad 202 act as masks for the processing or etching of the I/O cap layer 600.

Figure 9:
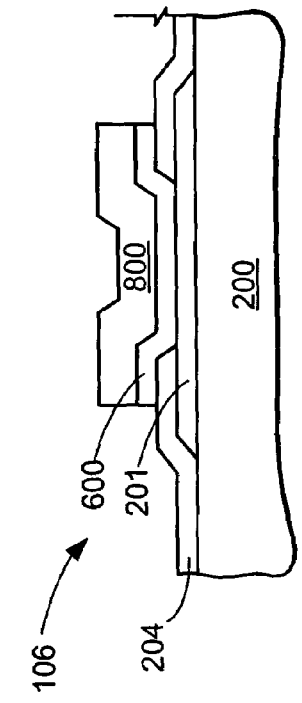
FIG. 9 is the structure of FIG. 8 after removal of the photoresist.

Referring now to FIG. 9, therein is shown the structure of FIG. 8 after removal of the photoresist 800 therein. The I/O cap layer 600 over the first I/O contact pad 201 can act as a wire bond pad and the I/O cap layer 600, and the first and second UBM layers 602 and 604 act as a UBM pad for over the second I/O contact pad 202.

The method 1000 includes: a step 1002 wherein a substrate has first and second I/O contact pads exposed through a passivation layer; a step 1004 where a first UBM layer is formed over the package substrate; a step 1006 where a second UBM layer is formed over the first UBM layer; a step 1008 where the first UBM layer is removed leaving a portion thereof over the second I/O contact pad; a step 1010 where the second UBM layer is removed while leaving a portion over the second I/O contact pad; and a step 1012 where a protective layer is formed over the first I/O contact pad while removing the first UBM layer.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing an integrated circuit package comprising:
   providing a substrate having first and second contact pads thereon exposed through a passivation layer thereon;
   forming a first metallurgy layer over the substrate;
   forming a second metallurgy layer over the first metallurgy layer;
   removing the first metallurgy layer while leaving a portion thereof over the second contact pad;
   removing the second metallurgy layer while leaving a portion thereof over the second contact pad; and
   forming a protective layer over the first contact pad while removing the first metallurgy layer.

2. The method as claimed in claim 1 wherein:
   removing the first metallurgy layer uses an etching process; and
   removing the second metallurgy layer uses an etching process with an etchant that reacts with the first contact pad to form the protective layer.

3. The method as claimed in claim 1 further comprising:
   forming a cap layer over the substrate under the first metallurgy layer;
   and wherein:
   removing the first metallurgy layer forms the protective layer over the cap layer; and
   removing the cap layer while leaving a portion thereof over the first and second contact pads.

4. The method as claimed in claim 1 further comprising:
   wire bonding a wire-bond pad semiconductor die or package substrate to the first contact pad;
   ball bonding a bump pad semiconductor die or package substrate to the second metallurgy layer over the second contact pad;
   connecting the substrate to a semiconductor die or package substrate; and
   encapsulating the substrate.

5. The method as claimed in claim 1 wherein:
   providing the substrate provides at least one of the first and second contact pads using aluminum, an alloy thereof, or a compound thereof;
   forming the first metallurgy layer uses titanium, an alloy thereof, or a compound thereof;
   forming the second metallurgy layer uses at least one of nickel, vanadium, copper, an alloy thereof and a compound thereof;
   removing the first metallurgy layer uses an etching process using fluorine;
   removing the second metallurgy layer uses an etching process using fluorine; and
   forming the protective layer forms the protective layer of aluminum fluoride.

6. A method for manufacturing an integrated circuit package comprising:
   providing a substrate having first and second contact pads thereon exposed through a passivation layer thereon;
   forming a first under bump metallurgy layer on the passivation layer;
   forming a second under bump metallurgy layer over the first under bump metallurgy layer;
   removing the first under bump metallurgy layer while leaving a portion thereof over the second contact pad;
   removing the second under bump metallurgy layer while leaving a portion thereof over the second contact pad;
   forming a protective layer over the first contact pad while removing the first under bump metallurgy layer; and
   connecting the substrate to additional substrates by the first and second contact pads.

7. The method as claimed in claim 6 wherein:
   providing the substrate provides the first contact pad using aluminum, an alloy thereof, or a compound thereof;
   forming the first under bump metallurgy layer uses titanium, an alloy thereof, or a compound thereof; and
   forming the second under bump metallurgy layer uses at least one of nickel, vanadium, copper, an alloy thereof and a compound thereof.

8. The method as claimed in claim 6 further comprising:
   forming a cap layer over the substrate under the first under bump metallurgy layer, the cap layer uses at least one of aluminum, copper, an alloy thereof, and a compound thereof;
   and wherein:
   removing the first under bump metallurgy layer forms the protective layer over the cap layer; and
   removing the cap layer while leaving a portion thereof over the first and second contact pads.

9. The method as claimed in claim 6 wherein:
   connecting the substrate includes:
      wire bonding a wire bond pad semiconductor die or package substrate to the first contact pad; and
      ball bonding a bump pad semiconductor die or package substrate to the second under bump metallurgy layer over the second contact pad.

10. The method as claimed in claim 6 wherein:
   connecting the substrate includes:
      connecting the substrate to a package substrate by a wire bond;
      connecting a further substrate to the substrate by a ball bond;
      encapsulating the substrate; and
      adding solder balls to the package substrate.

* * * * *

UNITED STATES PATENT AND TRADEMARK OFFICE
CERTIFICATE OF CORRECTION

| | |
|---|---|
| PATENT NO. | : 7,005,370 B2 |
| DATED | : February 28, 2006 |
| INVENTOR(S) | : Zhao et al. |

It is certified that error appears in the above-identified patent and that said Letters Patent is hereby corrected as shown below:

<u>Column 3,</u>
Line 46, delete "(AIF)" and insert -- (A1F) --.

Figure 10:
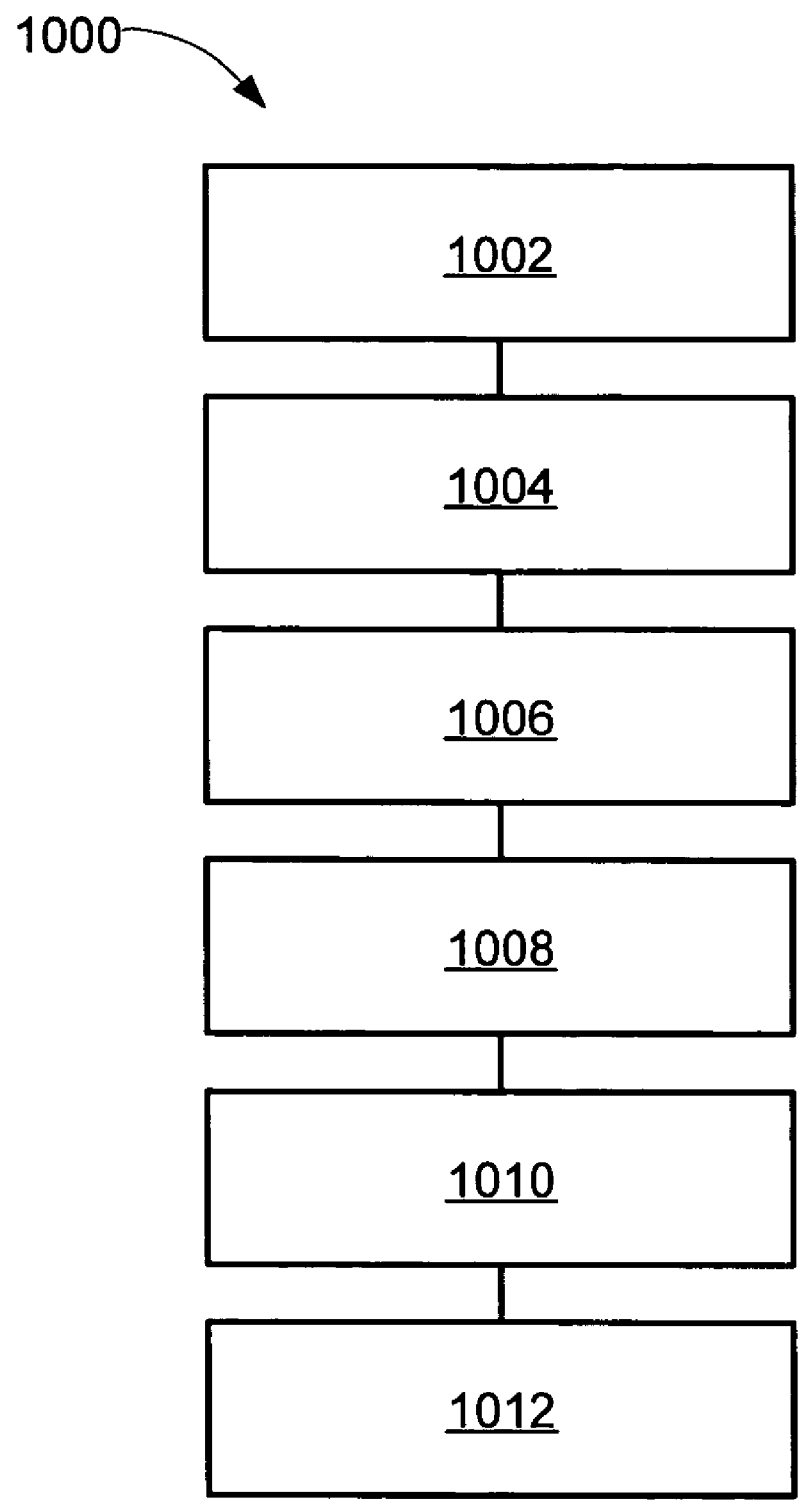
FIG. 10 is a flow chart of a method for manufacturing an integrated circuit package in accordance with the present invention.

<u>Column 4,</u>
Line 52, insert -- Referring now to FIG. 10, therein is shown a method 1000 for manufacturing an integrated circuit package in accordance with the present invention. --.

Signed and Sealed this

Eleventh Day of April, 2006

JON W. DUDAS
*Director of the United States Patent and Trademark Office*